(12) United States Patent
Liao

(10) Patent No.: US 7,560,350 B2
(45) Date of Patent: Jul. 14, 2009

(54) METHOD FOR FORMING STRAINED SEMICONDUCTOR DEVICE AND METHOD FOR FORMING SOURCE/DRAIN REGION

(75) Inventor: Chin-I Liao, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 114 days.

(21) Appl. No.: 11/308,643

(22) Filed: Apr. 17, 2006

(65) Prior Publication Data

US 2007/0243688 A1    Oct. 18, 2007

(51) Int. Cl.
*H01L 21/336*    (2006.01)
(52) U.S. Cl. ............... 438/300; 438/301; 257/E21.131
(58) Field of Classification Search ................ 438/300; 257/E21.1, E21.462
See application file for complete search history.

(56) References Cited

U.S. PATENT DOCUMENTS

| 4,717,681 | A   | * | 1/1988  | Curran ........................ 438/314 |
| 2006/0166414 | A1 | * | 7/2006  | Carlson et al. .............. 438/149 |
| 2006/0228863 | A1 | * | 10/2006 | Zhang et al. ................ 438/300 |
| 2007/0020864 | A1 | * | 1/2007  | Chong et al. ................ 438/300 |

* cited by examiner

*Primary Examiner*—Lex Malsawma
(74) *Attorney, Agent, or Firm*—Jianq Chyun IP Office

(57) ABSTRACT

A method for forming a strained semiconductor device is described. A substrate including a first semiconductor material and having a first conductivity type is provided. A semiconductor layer of a second conductivity type is formed contacting with the substrate, wherein the semiconductor layer includes the first semiconductor material and a second semiconductor material and has a dopant of the second conductivity type. In-situ annealing is then conducted to diffuse the dopant.

10 Claims, 1 Drawing Sheet

METHOD FOR FORMING STRAINED SEMICONDUCTOR DEVICE AND METHOD FOR FORMING SOURCE/DRAIN REGION

BACKGROUND OF THE INVENTION

1. Field of the Invention

The present invention relates to a semiconductor process. More particularly, the present invention relates to a method for forming a strained semiconductor device and to a method for forming an S/D region based on the former method.

2. Description of the Related Art

As the dimension of semiconductor device is greatly reduced, strain effects are often utilized to increase carrier mobility and improve the performance of the devices. For example, a strained source/drain (S/D) region of a Si-based PMOS transistor can be formed to increase the hole mobility and reduce the resistance of the S/D region. The stained S/D region can be formed by forming an opening at the corresponding position of an N-type silicon substrate and then filling boron-doped SiGe in the opening with selective epitaxy growth (SEG).

However, since the PN junction of the S/D region coincide with the interface between the N-type substrate and the P-type epitaxy SiGe layer in the above method, the current leakage through the PN junction of the S/D region is a problem.

SUMMARY OF THE INVENTION

In view of the foregoing, this invention provides a method for forming a strained semiconductor device, which can solve the above PN-junction leakage problem of a strained semiconductor device.

This invention also provides a method for forming an S/D region with reduced leakage based on the above method for forming a strained semiconductor device.

The method for forming a strained semiconductor device of this invention is described as follows. A substrate that includes a first semiconductor material and has a first conductivity type is provided. A semiconductor layer of a second conductivity type is formed contacting the substrate, wherein the semiconductor layer includes the first semiconductor material and a second semiconductor material and has a dopant of the second conductivity type. In-situ annealing is then conducted to diffuse the dopant.

The method for forming an S/D region of this invention is based on the above method for forming a strained semiconductor device, wherein an opening is formed in a substrate within a predetermined area for the S/D region before the semiconductor layer is formed and the semiconductor layer is formed through SEG with in-situ doping to be an epitaxial layer of the second conductivity type. With the in-situ annealing, the PN junction of the S/D region is formed shifted away from the interface between the substrate and the epitaxy layer.

Since the PN junction is shifted away from the interface between the substrate and the semiconductor layer in the above method for forming a strained semiconductor device, the current leakage through the PN junction can be reduced. Accordingly, by applying the method for forming a strained semiconductor device of this invention to an S/D process, especially a strained-S/D process of PMOS transistors, the current leakage through the PN junction of the S/D region is reduced.

It is to be understood that both the foregoing general description and the following detailed description are exemplary, and are intended to provide further explanation of the invention as claimed.

DESCRIPTION OF THE PREFERRED EMBODIMENTS

The method for forming a strained semiconductor device of this invention is further explained with an S/D process of MOS transistors through SEG. However, according to the aforementioned working mechanism of this invention, this invention is not restricted to apply to an S/D process only, but can also be applied to any process in which a PN junction is formed as described in paragraph [0006].

Figure 1:
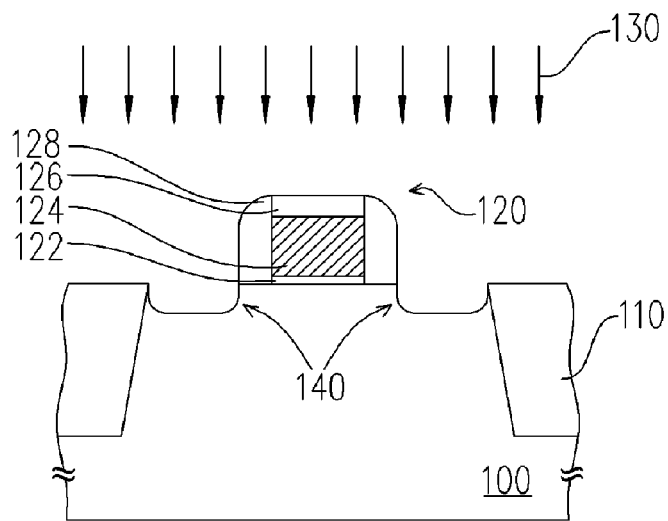
FIGS. 1-3 illustrate, in a cross-sectional view, a process flow of forming an S/D region of a MOS transistor according to a preferred embodiment of this invention.

Referring to FIG. 1, a substrate 100 that includes a first semiconductor material and has a first conductivity type is provided. The substrate 100 may have been formed with an isolation structure 110 and a mask structure thereon, wherein the mask structure may be a gate structure 120 that may include a stacked structure of a gate dielectric layer 122, a gate 124 and a cap layer 126 from bottom to top, and a spacer 126 on the sidewall of the stacked structure. The mask structure may alternatively be a patterned mask layer or a dummy gate structure that exposes a portion of the substrate 100 predetermined for forming the S/D region. Thereafter, dry etching 130 is performed using the gate structure 120 as a mask to form two openings 140, wherein the etching recipe is preferably adjusted such that each opening 140 has a rounded bottom corner to further reduce the current leakage.

Figure 2:
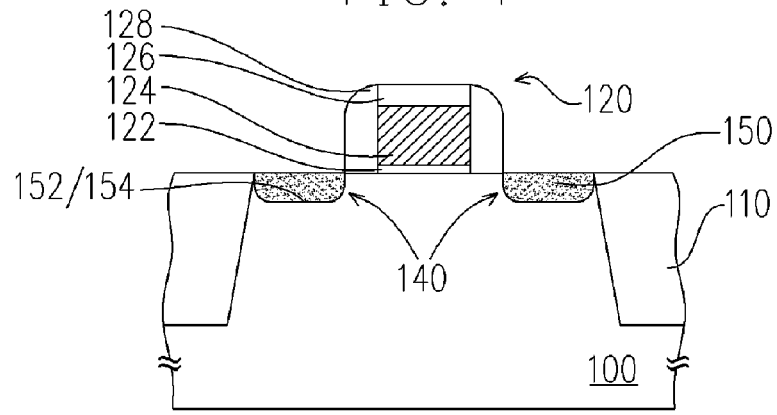

Referring to FIG. 2, based on the exposed portions of the substrate 100, an SEG process is conducted with in-situ doping to form an epitaxial layer 150 of a second conductivity type filling each opening 140 to form a PN junction 152. The epitaxial layer 150 contains a dopant of a second conductivity type and includes the first semiconductor material and a second semiconductor material. Because the materials of the substrate 100 and the epitaxial layer 150 are different, an interface 154 is naturally formed between the two coinciding with the PN junction 152. When the second conductivity is P-type and the epitaxial layer 150 is required to be strained in the opening 140 to increase hole mobility, the first and the second semiconductor materials are usually silicon and germanium (Ge), respectively. An epitaxy process for forming an epitaxial SiGe layer may be conducted at about 650-800° C., and the Ge concentration in the epitaxial SiGe layer is usually about 18-25 wt %. When the dopant of P-type is boron, the boron concentration in the epitaxial SiGe layer preferably ranges from about $1 \times 10^{20}/cm^3$ to about $3 \times 10^{20}/cm^3$. To form a boron-doped epitaxial SiGe layer, the reaction gases may include $SiH_4$, $GeH_4$ and $B_2H_6$, the carrier gas may be $H_2$, $N_2$ or a mixture of $H_2$ and $N_2$, and the pressure is preferably set at about 1-10 Torr, under which boron does not move to the space and the epitaxial layer is grown better. However, a slightly higher pressure is also feasible.

Figure 3:
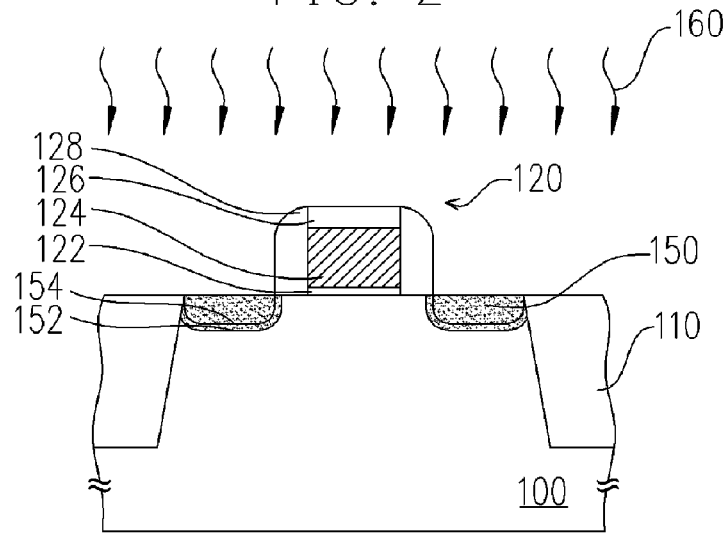

Referring to FIG. 3, in-situ annealing 160 is conducted to diffuse the dopant, such that the PN junction 152 is shifted away from the interface 154 between the substrate 100 and the epitaxial layer 150 to be the PN junction of the S/D region. The in-situ annealing 160 is conducted at a certain temperature for a certain period, such that the punch-through leakage of the channel is not increased significantly. When the epitaxial layer 150 is an epitaxial SiGe layer and the dopant of P-type is boron, a strained S/D region of a PMOS transistor is thus formed with the PN junction 152. To anneal a boron-doped epitaxial SiGe layer, the temperature of the in-situ annealing 160 is preferably set at about 850-950° C., the period of the in-situ annealing 160 is usually about 30-120 seconds, and the pressure in the in-situ annealing 160 may simply be set as that in the epitaxy process, i.e., about 1-10 Torr. Nevertheless, it is not necessary to keep the pressure at about 1-10 Torr purposely. It is also confirmed that germanium atoms do not diffuse at 850-950° C. after 120 seconds, for experiments showed that germanium atoms do not diffuse even at 1100° C. after 60 seconds.

Though the first semiconductor material and the second semiconductor materials are respectively exemplified as silicon and germanium in the above embodiment, the combination of the first and the second semiconductor materials can be varied readily according to the required strain and electrical properties. In addition, though the dopant is exemplified as a P-type dopant and the S/D region as a P-type S/D region of a PMOS transistor, the dopant may alternatively be an N-type dopant for forming a strained N-type S/D region while the substrate is of P-type.

Accordingly, since the PN junction of the S/D region is shifted away from the interface between the substrate and the epitaxy layer in the above embodiment, the current leakage through the PN junction of the S/D region is reduced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming a strained semiconductor device, comprising:
   providing a substrate comprising a first semiconductor material and having a first conductivity type;
   forming a semiconductor layer of a second conductivity type contacting with the substrate, wherein the semiconductor layer comprises the first semiconductor material and a second semiconductor material and has a dopant of the second conductivity type, and the semiconductor layer is formed with a selective epitaxy growth (SEG) process with in-situ doping of the dopant; and
   after forming the semiconductor layer with in-situ doping of the dopant, conducting an in-situ annealing to diffuse the dopant,
   wherein the first semiconductor material is silicon, the second semiconductor material is germanium, the dopant is boron, the SEG process is conducted at about 650-800° C., and the in-situ annealing is conducted ar about 850-950° C.

2. The method of claim 1, further comprising:
   forming an opening on the substrate before the semiconductor layer is formed, and the semiconductor layer is later formed filling the opening.

3. The method of claim 1, wherein the substrate has a patterned mask layer thereon, further comprising:
   forming an opening in the substrate with the patterned mask layer as an etching mask before the semiconductor layer is formed, and while the semiconductor layer is later formed filling the opening based on the substrate exposed by the patterned mask layer.

4. The method of claim 3, wherein the opening is formed to define an S/D region of a MOS transistor.

5. The method of claim 4, wherein the second conductivity is P-type, and the semiconductor layer is formed to be strained in the opening to increase hole mobility.

6. A method for forming an S/D region, comprising:
   providing a substrate that comprises a first semiconductor material and has a first conductivity type;
   forming an opening in a substrate within a predetermined area for the S/D region;
   conducting a selective epitaxy growth (SEG) process with in-situ doping to form an epitaxial layer of a second conductivity type filling the opening, wherein the epitaxial layer comprises the first semiconductor material and a second semiconductor material and has a dopant of the second conductivity type; and
   after forming the epitaxial layer with in-situ doping of the dopant, conducting in-situ annealing to diffuse the dopant,
   wherein the first semiconductor material is silicon, the second semiconductor material is germanium, the dopant is boron, the SEG process is conducted at about 650-800° C., and the in-situ annealing is conducted at about 850-950° C.

7. The method of claim 6, wherein the second conductivity type is P-type, and the epitaxy layer is formed to be strained in the opening to increase hole mobility.

8. The method of claim 6, wherein the in-situ annealing is conducted for about 30-120 seconds.

9. The method of claim 6, wherein the in-situ annealing is conducted under a pressure of about 1-10 Torr.

10. The method of claim 6, wherein the substrate is provided with a gate structure thereon and the opening is formed using the gate structure as an etching mask.

* * * * *